United States Patent
Bal

(10) Patent No.: US 6,642,743 B2
(45) Date of Patent: Nov. 4, 2003

(54) SYSTEM FOR RAPID CONFIGURATION OF A PROGRAMMABLE LOGIC DEVICE

(75) Inventor: Ankur Bal, Ghaziabad (IN)

(73) Assignee: STMicroelectronics Ltd., Uttar Pradesh (IN)

(*) Notice: Subject to any disclaimer, the term of this patent is extended or adjusted under 35 U.S.C. 154(b) by 9 days.

(21) Appl. No.: 10/072,458

(22) Filed: Feb. 7, 2002

(65) Prior Publication Data

US 2002/0114200 A1 Aug. 22, 2002

(30) Foreign Application Priority Data

Feb. 9, 2001 (IN) ................................................ 138/01

(51) Int. Cl.[7] ............................................. H03K 19/177
(52) U.S. Cl. ............................. 326/37; 326/38; 326/95; 326/98; 365/154; 365/221
(58) Field of Search .............................. 326/34–41, 98, 326/95; 711/170; 365/189.08, 230.06

(56) References Cited

U.S. PATENT DOCUMENTS

| | | | |
|---|---|---|---|
| 5,336,951 A | 8/1994 | Josephson et al. | 307/465 |
| 5,818,776 A * | 10/1998 | Shibutani et al. | 365/221 |
| 5,889,413 A | 3/1999 | Bauer | 326/40 |
| 5,995,988 A | 11/1999 | Freidin et al. | 708/232 |
| 6,057,704 A | 5/2000 | New et al. | 326/38 |
| 6,222,757 B1 * | 4/2001 | Rau et al. | 365/154 |
| 6,507,943 B1 * | 1/2003 | Kelem | 716/16 |

FOREIGN PATENT DOCUMENTS

EP          0454352          10/1991    ......... H03K/19/177

\* cited by examiner

*Primary Examiner*—Vibol Tan
(74) *Attorney, Agent, or Firm*—Lisa K. Jorgenson; Allen, Dyer, Doppelt, Milbrath & Gilchrist, P.A.

(57) ABSTRACT

A system for relatively rapidly configuring reconfigurable devices with a plurality of latches is provided. The number of clock cycles for loading the configuration data may be reduced by a substantial amount, and the fidelity of data loaded into the configuration latches may be relatively high. The invention also incorporates procedures for configuring multiple reconfigurable devices, which are similar to daisy chaining techniques.

30 Claims, 5 Drawing Sheets

SYSTEM FOR RAPID CONFIGURATION OF A PROGRAMMABLE LOGIC DEVICE

FIELD OF THE INVENTION

The present invention relates to the field of electronic circuits, and, more particularly, to programmable logic devices.

BACKGROUND OF THE INVENTION

Programmable logic devices, such as field-programmable gate arrays (FPGAs) and complex programmable logic devices (CPLDs), include a plurality of memory elements/reconfigurable elements which store circuit information and control the programmable logic circuit's operation. The reconfigurable elements in FPGAs/CPLDs are usually complementary metal oxide semiconductor (CMOS) latches. These latches store information/data bits that determine the lookup table logic, the routing information, and other details which are solely dependent on the circuit being implemented in the given device. As the number of these latches increases, it takes quite some time to configure the FPGA/CPLD for a given circuit implementation. The configuration data is generated by software tools that map, place, and route the input circuit netlist.

Typical prior art approaches implement the concept illustrated in FIG. 1. The configuration latches are connected as arrays of latches 11 with the write signal of the latches in rows 5 tied together. A shift register structure 1 is beside the latch array which enables the write signal of the latches in rows, one row at a time. The write activation bit 4 shifts across the array to activate the write signals in rows.

Another shift register 3 has a length equal to the number of columns in the latch array. The purpose of this register is to serially accept a data frame to be loaded into a particular row of the latch array. The length of this register may vary depending on any error correction or parity check circuits which may be incorporated in the device. A data frame is fully loaded into the shift register 3 in n clock cycles, where n is the length of the shift register 3. A few more clock cycles are consumed in advancing the write control bit in the shift register 1. There may also be another write signal WR that is activated only after the data frame to be loaded into the shift register 3 and the write control bit in the write control shift register 1 are in place.

The data frame load and the write signal increment 4 continue until all the configuration bits are loaded into the device. The control circuitry for executing and synchronizing the data frame load and the write increment operation is not shown, though such circuitry is well known to those skilled in the art. Thus, according to the prior art, the total number of clock cycles needed to configure an FPGA/CPLD is greater than the total number of configuration latches in the given FPGA/CPLD.

In U.S. Pat. No. 5,995,988 to Freidin et al., serial loading of bits in groups has been described. Yet, this approach may require a relatively long time for loading.

THE SUMMARY OF THE INVENTION

An object of the present invention is to provide a programmable logic device in which a number of clock cycles required for configuration are reduced. In particular, this may be accomplished by presetting all the configuration latches to a predetermined state and then selectively changing states of specific configuration latches in the latch array.

This and other objects, features, and advantages of the present invention are provided by a system for the rapid configuration of a programmable logic device which may include first means or circuitry for selecting a logically continuous array of bits out of a total configuration map. Furthermore, second means or circuitry may also be included for selecting one or more of the bits in the selected arrays that are required to be toggled, as well as a third means or circuitry for changing the selected bits.

More particularly, the first means may include a write control shift register for selecting a row of the configuration memory of the programmable logic device. The second means may include a decoder for selecting one column at a time of the configuration memory of the programmable logic device. Further, the third means may include a pass transistor for connecting the input of a memory latch storing the bit to a logic 0 or logic 1 level.

Additionally, means or circuitry may be provided to generate the shift signal for the write control shift register (WCSR) by a combination of a defined output of the second means and a clock signal. For example, such means may include an AND gate, and the decoder may be a binary decoder. Further, multiple programmable logic devices may advantageously be enabled sequentially by a sequencing mechanism.

A counter may also be included for selecting the programmable logic device location. Additionally, the input to the decoder may be from a memory including the addresses of the locations of bits/bit clusters to be changed. The memory may include the values of only those locations that differ in the present configuration from the desired values in the new configuration to minimize memory size and configuration time. Also, the configuration memory may be programmed in multiple bits at a time using selection means and toggling means, in which the selection means may include decoders. Furthermore, the sequencing mechanism may include a daisy chain mechanism.

BRIEF DESCRIPTION OF THE DRAWINGS

The invention will now be described with reference to the accompanying drawings, in which.

DETAILED DESCRIPTION OF THE PREFERRED EMBODIMENTS

Figure 1:
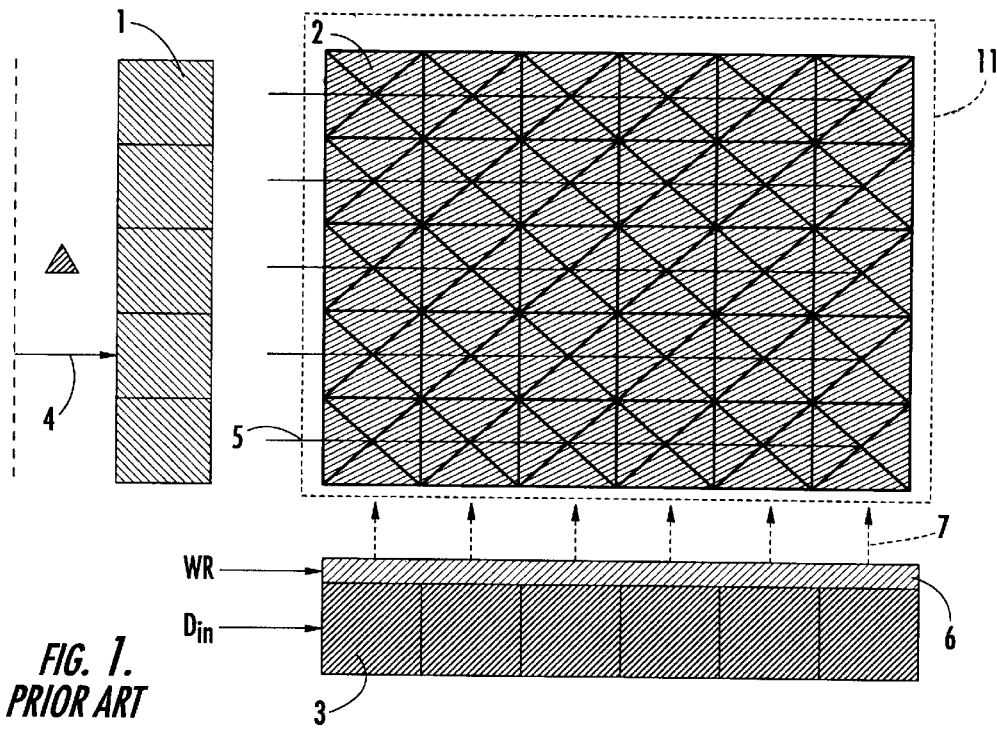
FIG. 1 is a schematic block diagram illustrating a prior art approach for loading configuration data in a programmable logic device including reconfigurable elements.
Figure 2:
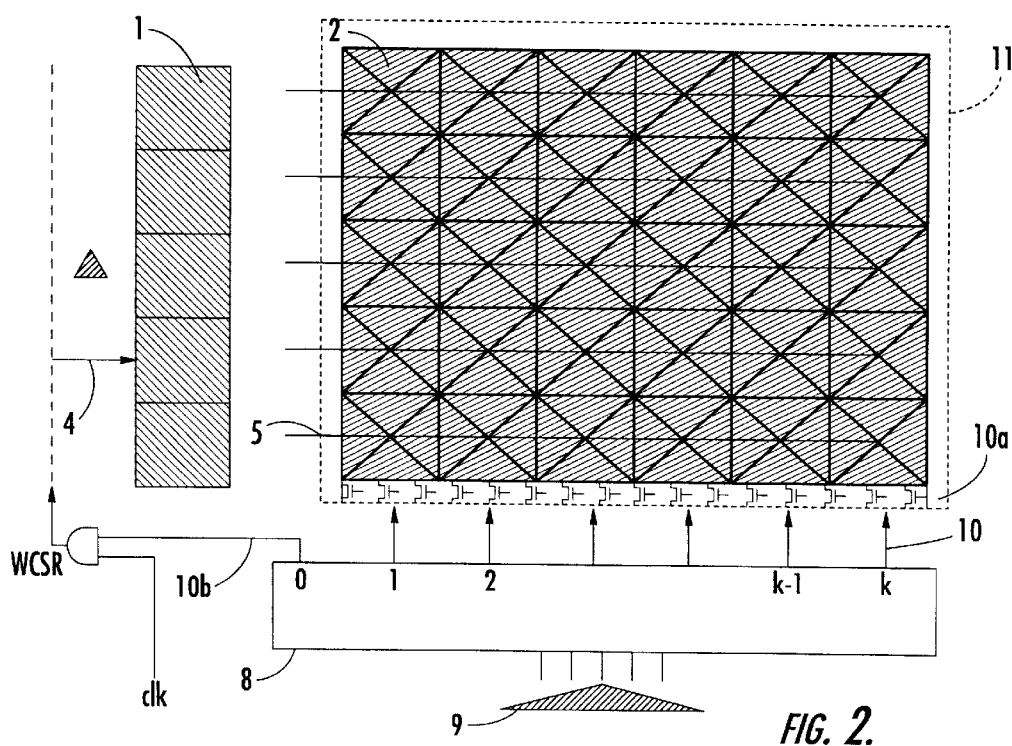
FIG. 2 is a schematic block diagram illustrating a system for configuring a programmable logic device according to the invention.

Referring initially to FIG. 2, an array of latches 11 is arranged in an identical fashion as in the prior art described above with reference to FIG. 1. The decoder 8 has n inputs 9 and $2^n$ outputs 10, 10b. A control signal WCSR is generated based upon an output of the decoder 8 and a clock signal for the write control bit in the shift register 1, as will be explained further below.

Figure 3:
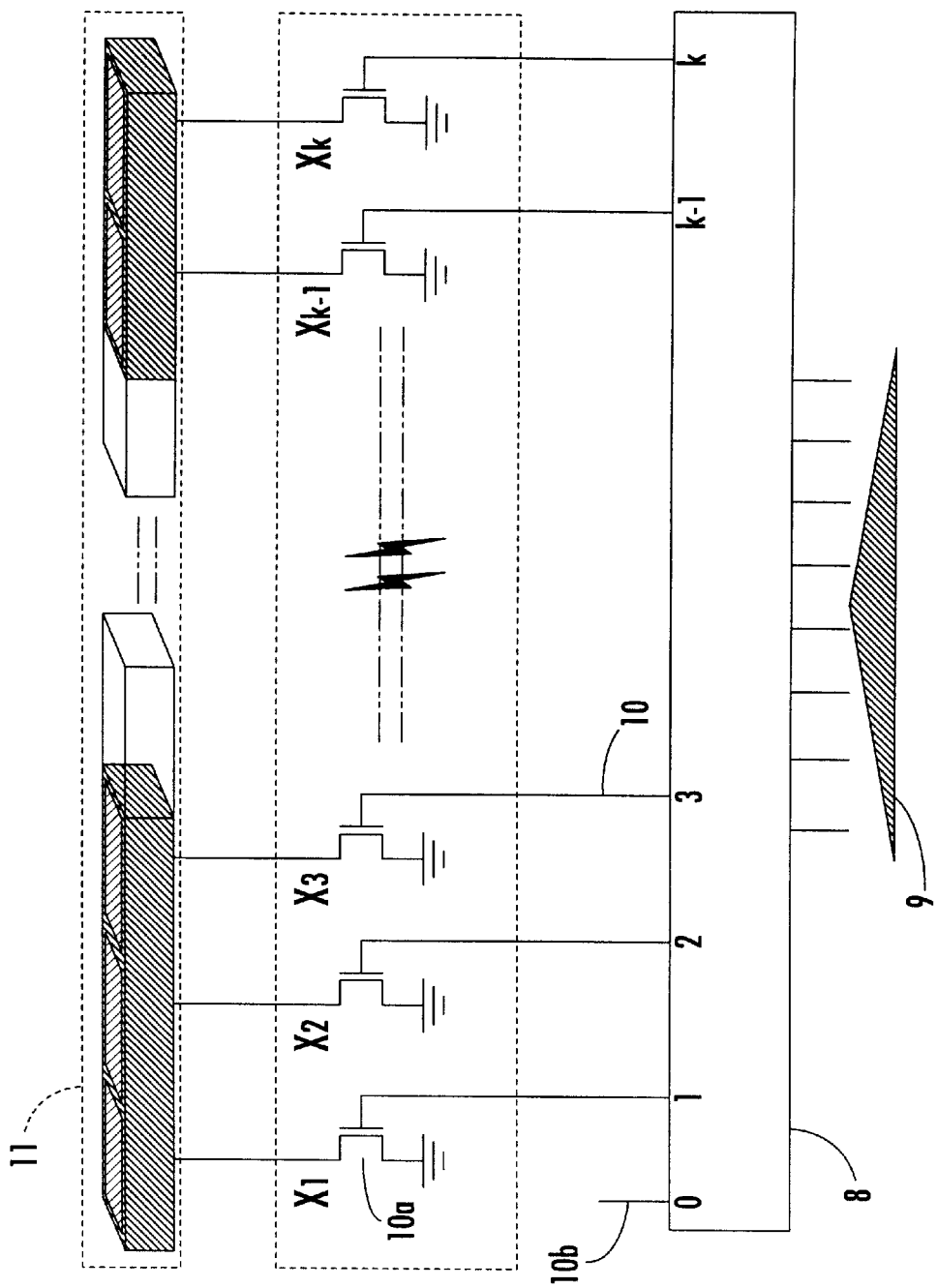
FIG. 3 is a schematic block diagram illustrating the arrangement for selective programming according to the invention of logic 0 values in one row of a configuration memory of a programmable logic device.
Figure 4:
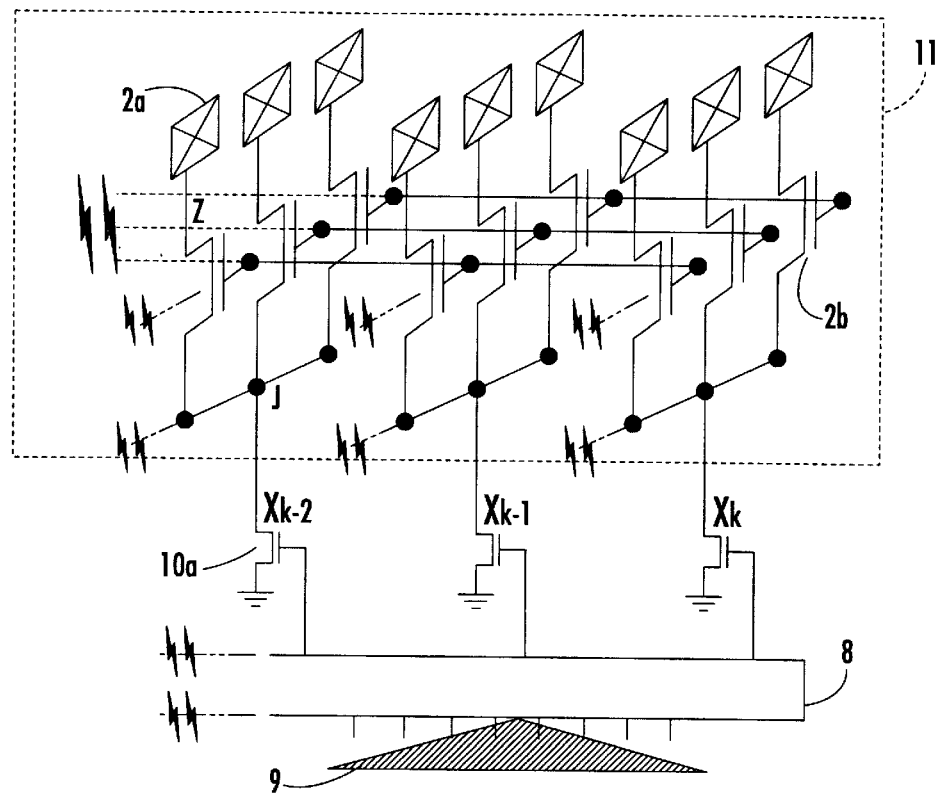
FIG. 4 is a schematic diagram illustrating the arrangement for selective programming of logic 0 values in a multiplicity of rows of the configuration memory in accordance with the present invention.

Assuming that there are eight inputs 9 to the decoder 8 in the present embodiment, there will be 256 outputs, i.e. K=255. This also implies that there will be 255 columns (as described further below) in the latch array of the present embodiment. Further details of the various circuits are illustrated in FIGS. 3 and 4. The gates of write pass transistors 2b in each row of the latch array are tied together and connected to the write control shift register 1.

It can also be seen that one end of the pass transistors 2b in a column are tied together and connected to pull down n-channel pass transistors 10a whose gates are controlled by the decoder output. The write control shift register 1 shifts the write signal bit to activate one row of the latch array at a time. The eight lines entering the decoder 8 receive signals from the memory/software-hardware interface that contains configuration data.

Figure 5:
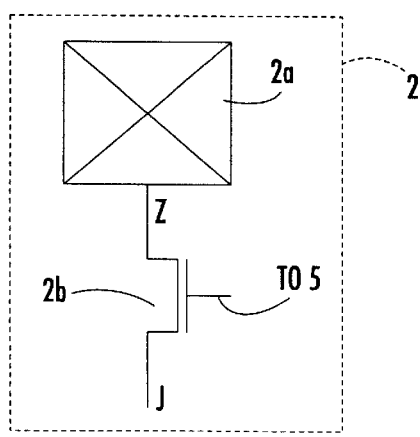
FIG. 5 is a schematic block diagram illustrating the basic arrangement for programming a logic 0 or logic 1 value in a single latch of the configuration memory in accordance with the present invention.
Figure 6:
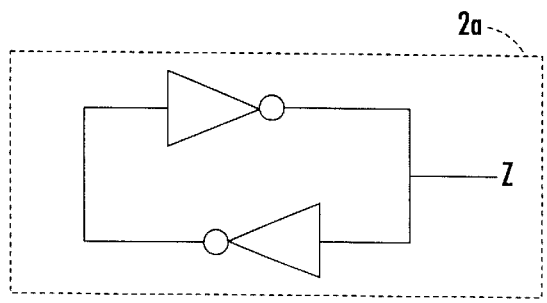
FIG. 6 is a schematic diagram illustrating the latch structure of the configuration memory of the programmable logic device to be configured in accordance with the present invention.

The following sequence of events explain the configuration for the present embodiment. First, a global signal resets all the latches in the array such that all nodes Z (FIG. 5) are preset to logic 1. The basic latch structure used in the present embodiment of the proposed invention is illustrated in FIG. 6, which will be understood by those skilled in the art. Furthermore, if an on-board memory is used to store the configuration bits, the data is organized such that the memory contains locations of those latches in the configuration latch array whose data is required to be toggled to logic 0. Thus, the memory output will correspond to the decoder input and, as such, will be eight bits wide.

In addition, referring once again to FIGS. 2 and 3, a data frame may be 255 bits wide to eliminate the WR signal used in the prior art (FIG. 1) altogether. One of the 256 possible outputs from the decoder is wired as a WCSR, preferably the zero output, which of course corresponds to the $0^{th}$ output, or $X_0$. This output comes into play during the transition interval of the write control shift register signal (WCSR) to an adjacent row in the latch array.

The signal WCSR acts as a clock to the write control shift register 1 that shifts a logic 1 across the shift register 1, the remainder of which is set to logic 0. It is similar in operation to a ring counter, which is well known to those skilled in the art. In other words, once a row in the latch array is configured, the decoder input is made zero, and only then does the signal WCSR shift the activation bit (logic 1) to an adjacent register cell in the shift register 1 to enable the adjacent row in the latch array for configuration. The $0^{th}$ output $X_0$ of the decoder 5 is ANDed with a clock signal clk to synchronize the operation. This clock is preferably the clock driving the counter 15.

It will therefore be understood that the latch array is configured one row at a time. The first cell (the bottom-most cell in FIG. 2) of the shift register 1 is initialized to logic 1 to initiate ring counter operation. A configuration clock drives a counter which begins the configuration process by addressing the memory contents as it advances the count. The memory address bus 14 is connected to the counter output. The eight bit wide memory output 9 addresses the decoder 8 inputs, which in turn pulls down the latch array cells, in that order, in the enabled row.

Once the desired latch cells in the row have been pulled down, a zero output from the memory to the decoder pulls up the signal WCSR, which in turn advances the shift register 1 at the arrival of the synchronizing clock signal clk. Now the row adjacent to the previous one is enabled in the latch array. The process continues until the device is fully/partially configured, depending on the design.

Figure 9:
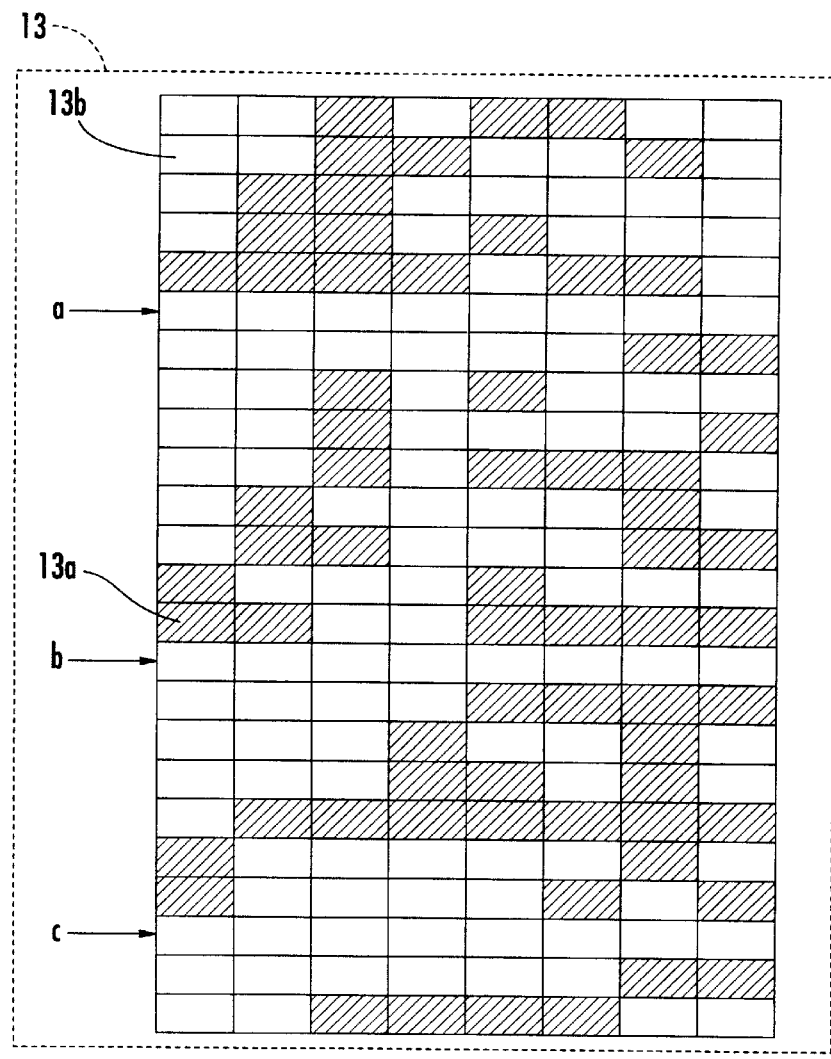
FIG. 9 is a schematic block diagram illustrating sample memory contents of the programmable logic device.

An important point to note is that the individual row data stored in the memory is separated by a zero to generate the signal WCSR properly. A sample memory's contents are illustratively shown in FIG. 9. Shaded regions 13a indicate logic ones and non-shaded regions 13b indicate logic zeros. It can be seen that the reference letters a, b and c point out the zero data which demarcate configuration information to be addressed to different rows. Other than synchronizing the signal WCSR, the synchronizing clock signal clk becomes very important when the memory 13 contains consecutive zeros. These zeroes indicate row skip operations which would not have been carried out if decoder 5 output $X_0$ directly drove the WCSR line.

Figure 7:
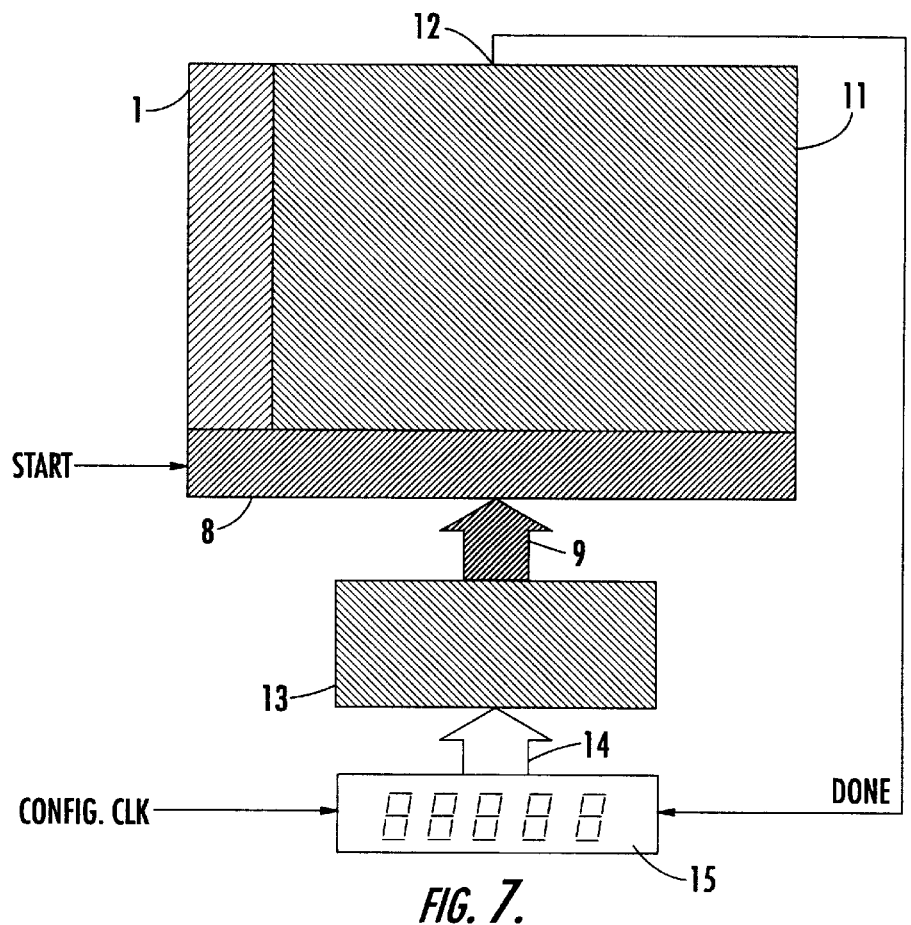
FIG. 7 is a schematic block diagram illustrating an arrangement for controlling the selective programming of the configuration memory using a counter and a memory device according to the invention.

Once the configuration is complete, the counter may be halted by a signal generated by the FPGA/CPLD. Referring to FIG. 7, which illustrates a top level of the device, the configuration memory 13 and the counter 15, configuration is enabled by a signal START and inhibited by a signal DONE. These signals can be generated in numerous ways known to those of skill in the art.

Figure 8:
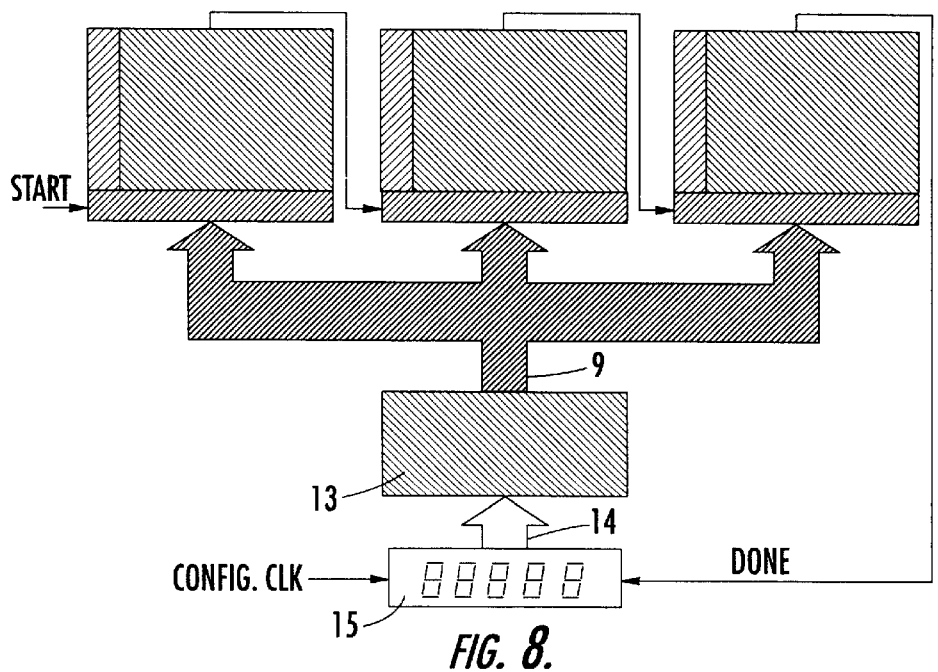
FIG. 8 is a schematic block diagram illustrating the configuration of more than one programmable logic device connected in a daisy chain in accordance with the present invention.

More than one device can be configured by a technique illustrated in FIG. 8. This scheme is similar to the daisy chain technique used for configuring multiple FPGAs in prior art devices. The signals START and DONE are sequentially connected to enable configuration for devices 1, 2 and 3, in that order. The memory output bus is common to the decoder inputs of the three devices. Counter operation and memory organization remain the same as for a single device, the only difference being in counter and memory size for accommodating data for the three devices.

The aforementioned methodologies for the configuration of FPGAs/CPLDs is relatively fast compared to the above described prior art techniques. But, at the same time, the proposed technique may require a significant memory overhead, although this may be minimized by clever design and configuration data manipulation. Some possible embodiments of the present invention which minimize memory overhead are now described.

In one embodiment of the present invention the latches may be pulled up instead of being pulled down by the decoder arrangement. It can be decided whether to incorporate pull-up or pull-down transistors by assessing the configuration bit stream for logic zeros and ones. The FPGA/CPLD can be designed to maximize logic zeros or logic ones for its configuration latches during circuit implementation in the device.

Another advanced embodiment is possible which has the flexibility of both pulling up and pulling down configuration latches. Such an FPGA/CPLD could be reconfigured from some present configuration without presetting all the latches to logic zero or logic one. The memory driving the decoder is loaded with only the contents of those configuration memory locations that are different in the new configuration map with respect to the present contents.

Figure 10:
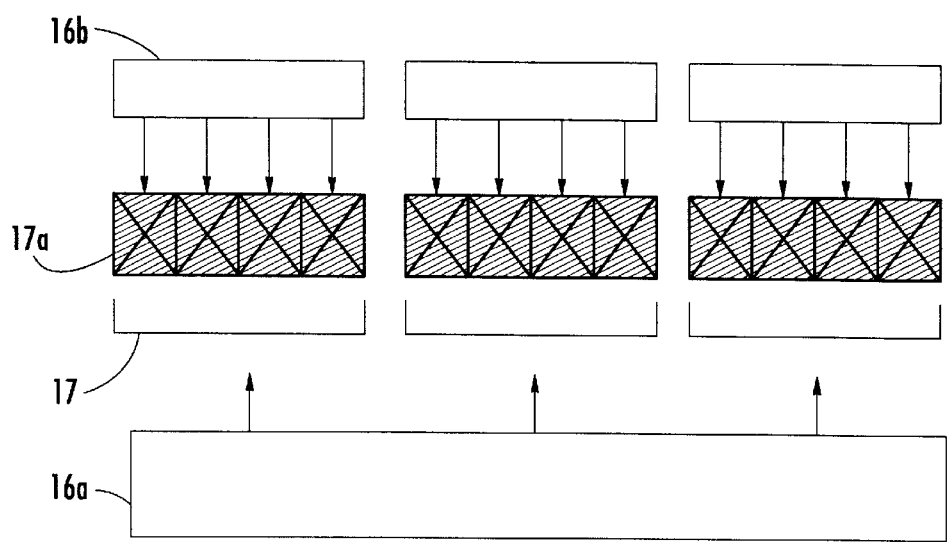
FIG. 10 is a schematic block diagram illustrating an arrangement for programming multiple values simultaneously according to the present invention using a plurality of decoders and/or shift registers.

The aforementioned embodiments have primarily been concerned with changing/toggling single bits in the configuration latch array. Other embodiments of the present invention are possible which address the issue of granularity. A decoder hierarchy, in which a plurality of decoders in different hierarchies select variable groups of configuration latches in the array is possible which therefore extends the invention to a coarser latch array. Referring to FIG. 10, a decoder 16a can select latches 17a in groups 17 of four. These latches 17a can further be loaded with the desired data through a secondary decoder or a serial-in parallel-out shift register 16b.

Thus, an in-circuit, rapid reconfiguration is provided by the proposed configuration architecture and its embodiments. The decoders used in various embodiments of the present invention can also be re-used as FPGA/CPLD logic resources once the configuration process is complete. Of course, it will be appreciated that such resource sharing may not be possible in some of the above described embodiments.

That what is claimed is:

1. A system for configuring at least one programmable logic device comprising a configuration memory, the system comprising:
    first means for selecting a logically continuous array of bits from the configuration memory;
    second means for selecting at least one of the bits from the selected logically continuous array of bits which requires toggling; and
    third means for changing the at least one bit which requires toggling.

2. The system according to claim 1 wherein said first means comprises a write control shift register for selecting a row of the configuration memory of the programmable logic device.

3. The system according to claim 2 further comprising generation means for generating a shift signal for said write control shift register based upon an output of said second means and a clock signal.

4. The system according to claim 3 wherein said generation means comprises a logic gate.

5. The system according to claim 1 wherein said second means comprises a decoder for selecting a column of the configuration memory of the programmable logic device.

6. The system according to claim 5 wherein said decoder comprises a binary decoder.

7. The system according to claim 5 further comprising a memory for selectively storing an address of the at least one bit; and wherein said decoder reads the address from said memory.

8. The system according to claim 7 wherein the address is only stored in said memory if the at least one bit has changed from a prior configuration.

9. The system according to claim 1 further comprising a memory latch for storing the at least one bit; and wherein said third means comprises a pass transistor for connecting an input of said memory latch to a predetermined logic value.

10. The system according to claim 1 further comprising a sequencer for allowing the system to sequentially configure a plurality of programmable logic devices.

11. The system according to claim 10 wherein said sequencer comprises a daisy chain sequencer.

12. The system according to claim 1 further comprising selection means and toggling means for programming the configuration memory a plurality of bits at a time.

13. The system according to claim 12 wherein said selection means comprise a plurality of programming decoders.

14. A system for configuring at least one programmable logic device comprising a configuration memory, the system comprising:
    a write control shift register for selecting a logically continuous a ray of bits from the configuration memory;
    a decoder for selecting at least one of the bits from the selected logically continuous array of bits which requires toggling; and
    a transistor for changing the at least one bit which requires toggling.

15. The system according to claim 14 wherein said write control shift register selects a row of the configuration memory of the programmable logic device.

16. The system according to claim 15 further comprising generation circuitry for generating a shift signal for said write control shift register based upon an output of said second means and a clock signal.

17. The system according to claim 16 wherein said generation circuitry comprises a logic gate.

18. The system according to claim 14 wherein said decoder selects a column of the configuration memory of the programmable logic device.

19. The system according to claim 14 wherein said decoder comprises a binary decoder.

20. The system according to claim 14 further comprising a memory for selectively storing an address of the at least one bit; and wherein said decoder reads the address from said memory.

21. The system according to claim 20 wherein the address is only stored in said memory if the at least one bit has changed from a prior configuration.

22. The system according to claim 20 further comprising a memory latch for storing the at least one bit; and wherein said transistor connects an input of said memory latch to a predetermined logic value.

23. The system according to claim 14 further comprising a sequencer for allowing the system to sequentially configure a plurality of programmable logic devices.

24. The system according to claim 23 wherein said sequencer comprises a daisy chain sequencer.

25. The system according to claim 14 further comprising a plurality of programming decoders for programming the configuration memory a plurality of bits at a time.

26. A method for configuring at least one programmable logic device comprising a configuration memory, the method comprising:
    selecting a logically continuous array of bits from the configuration memory;
    selecting at least one of the bits from the selected logically continuous array of bits which requires toggling; and
    changing the at least one bit which requires toggling.

27. The method according to claim 26 wherein selecting the logically continuous array of bits from the configuration memory comprises selecting a row of the configuration memory.

28. The method according to claim 26 wherein selecting the at least bit from the selected logically continuous array comprises selecting a column of the configuration memory.

29. The method according to claim 26 further comprising using a sequencer to sequentially configure a plurality of programmable logic devices.

30. The method according to claim 29 wherein the sequencer comprises a daisy chain sequencer.

* * * * *